United States Patent
Takayoshi et al.

(10) Patent No.: US 10,923,252 B2
(45) Date of Patent: Feb. 16, 2021

(54) RESISTOR, CIRCUIT BOARD, AND ELECTRONIC DEVICE

(71) Applicant: KYOCERA CORPORATION, Kyoto (JP)

(72) Inventors: Shodai Takayoshi, Satsumasendai (JP); Yoshio Ohashi, Satsumasendai (JP); Takeyuki Arai, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/337,505

(22) PCT Filed: Sep. 28, 2017

(86) PCT No.: PCT/JP2017/035182
§ 371 (c)(1),
(2) Date: Mar. 28, 2019

(87) PCT Pub. No.: WO2018/062373
PCT Pub. Date: Apr. 5, 2018

(65) Prior Publication Data
US 2019/0279793 A1    Sep. 12, 2019

(30) Foreign Application Priority Data
Sep. 29, 2016    (JP) ............... JP2016-191555

(51) Int. Cl.
*H05K 7/00* (2006.01)
*H01C 7/00* (2006.01)
(Continued)

(52) U.S. Cl.
CPC ............. *H01C 7/003* (2013.01); *H01B 3/004* (2013.01); *H01C 7/06* (2013.01); *H01C 17/06526* (2013.01); *H01C 17/06566* (2013.01); *H05K 1/167* (2013.01); *H05K 1/181* (2013.01); *H05K 3/282* (2013.01); *H01C 17/06593* (2013.01);
(Continued)

(58) Field of Classification Search
USPC ............................................ 361/782
See application file for complete search history.

(56) References Cited

U.S. PATENT DOCUMENTS 6,020,048 A * 2/2000 Oka .................... H01L 23/498
                                                      174/257
8,484,815 B2 * 7/2013 Takeuchi ................... 29/25

FOREIGN PATENT DOCUMENTS

EP    2793539 A1    10/2014
JP    S6059701 A    4/1985
(Continued)

OTHER PUBLICATIONS

Zhou et al., "Dictionary of New Materials", Dec. 1996, 4 pages, 1. Edition, Shanghai, China.

*Primary Examiner* — Andargie M Aychillhum
(74) *Attorney, Agent, or Firm* — Viering, Jentschura & Partner MBB

(57) ABSTRACT

A resistor includes materials including copper, nickel, and lanthanum boride. A content of the materials is 40% by mass or more with respect to a total material content of the resistor. The copper includes copper particles having a particle diameter of 2.5 μm or more. In addition, a circuit board includes a substrate, the resistor on the substrate, a metal layer on the resistor and a glass layer on the resistor. Further, an electronic device includes the circuit board and an electronic component on the metal layer.

7 Claims, 1 Drawing Sheet

(51) Int. Cl.
  *H01C 17/065*   (2006.01)
  *H05K 1/16*    (2006.01)
  *H05K 1/18*    (2006.01)
  *H01B 3/00*    (2006.01)
  *H01C 7/06*    (2006.01)
  *H05K 3/28*    (2006.01)
  *H05K 3/12*    (2006.01)

(52) U.S. Cl.
  CPC ........... *H05K 3/1216* (2013.01); *H05K 3/288* (2013.01); *H05K 2203/107* (2013.01)

(56) References Cited

FOREIGN PATENT DOCUMENTS

| | | |
|---|---|---|
| JP | H03274703 A | 12/1991 |
| JP | H04206504   | 7/1992 |
| JP | H10107207 A | 4/1998 |
| JP | 2001284741 A | 10/2001 |
| JP | 2006073280 A | 3/2006 |
| JP | 2007176785 A | 7/2007 |
| JP | 2007294547 A | 11/2007 |
| JP | 2015046567 A | 3/2015 |
| WO | 2013088957 A1 | 6/2013 |

* cited by examiner

RESISTOR, CIRCUIT BOARD, AND ELECTRONIC DEVICE

CROSS-REFERENCE TO RELATED APPLICATIONS

This application is a national stage application according to 35 U.S.C. 371 based on an International Application No. PCT/JP2017/035182 filed on Sep. 28, 2017, which claims priority to Japanese Patent Application No. 2016-191555 filed on Sep. 29, 2016, the contents of which are entirely incorporated herein by reference.

FIELD

The present disclosure relates to a resistor, a circuit board provided with the same, and an electronic device.

BACKGROUND

Electronic devices are known in which various electronic components such as semiconductor devices, heat generating devices, and Peltier devices are mounted on a circuit board. Here, the circuit board may be provided with a resistor for preventing an excessive current from flowing.

For example, Japanese Unexamined Patent Publication JP-A 2007-294547 discusses a semiconductor light emitting device including a resistance whose resistance value corresponds to the light intensity of a light emitting element in order to control a current flowing in a light emitting element.

SUMMARY

A resistor may include materials including copper, nickel, and lanthanum boride. A content of the materials with respect to a total material content of the resistor may be 40% by mass or more. The copper may include copper particles having an average particle diameter of 2.5 µm or more.

A circuit board may include a substrate, the resistor on the substrate, a metal layer on the resistor, and a glass layer on the resistor.

An electronic device may include the circuit board described above and an electronic component located on the metal layer of the circuit board.

DETAILED DESCRIPTION

Figure 1:
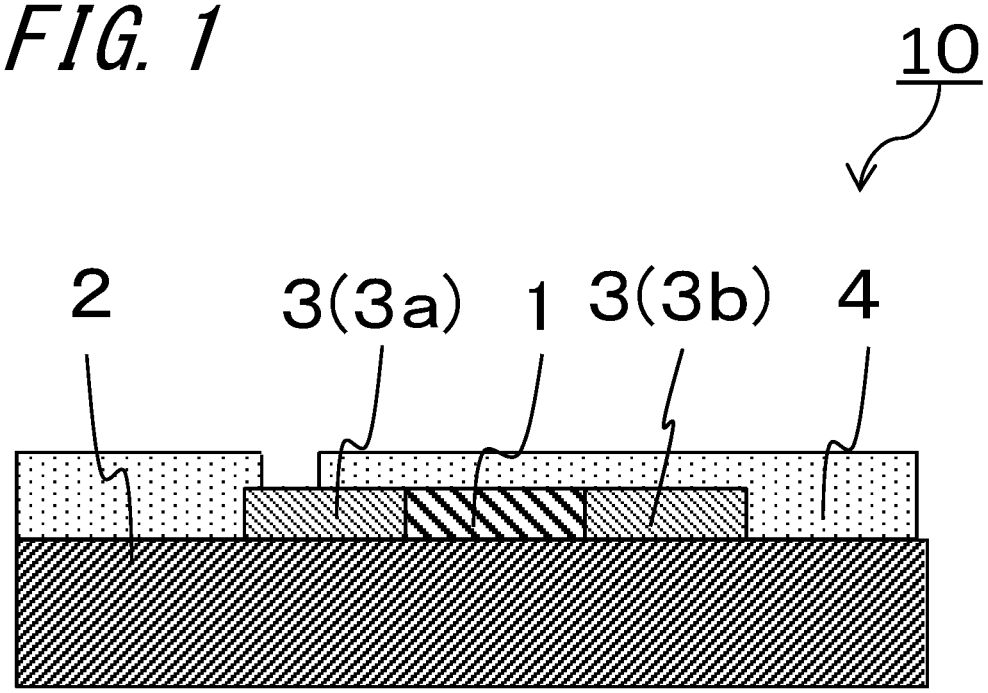
FIG. 1 is a cross-sectional view illustrating an example of a circuit board including a resistor according to a non-limiting aspect of the present disclosure.

In order to obtain an arbitrary resistance value, a resistor paste obtained by mixing various components is used for a resistor, and the resistor is formed by applying the resistor paste on a substrate and then firing it.

In recent years, along with miniaturization and thinning of an electronic device and high integration of electronic components, miniaturization and thinning of a resistor and complication of a resistor shape are required. However, when a resistor having a small size, a thin shape, and a complex shape is formed, a resistance value of the resistor tends to vary.

It is known that a resistor in which a variation in resistance value varies can be made into a resistor having a uniform resistance value by laser trimming in which the resistor is cut by a laser beam. In recent years, as laser trimming has been increasingly performed, resistors which are easy to adjust resistance values by laser trimming are required.

In a non-limiting aspect of the resistor of the present disclosure, it is easy to adjust the resistance value by laser trimming. Hereinafter, a non-limiting aspect of the resistor of the present disclosure will be described in detail.

A non-limiting aspect of the resistor of the present disclosure includes copper, nickel, and lanthanum boride a total content of which is 40% by mass or more, and includes copper particles having a particle diameter of 2.5 µm or more. Here, the copper particles are particles containing 70% by mass or more of copper out of 100% by mass of all the components constituting the copper particles.

Since a non-limiting aspect of the resistor of the present disclosure satisfies such a configuration, it is possible to easily adjust the resistance value by laser trimming. Here, the reason why the resistance value can be easily adjusted by laser trimming is that the resistor includes the composition described above and includes copper particles having a particle diameter of 2.5 µm or more. Specifically, when the resistor is irradiated with a laser beam, copper particles having a particle diameter of 2.5 µm or more are likely to be shed, so laser trimming can be easily performed.

In addition, a non-limiting aspect of the resistor of the present disclosure may include an inorganic component in addition to copper, nickel, and lanthanum boride. Here, the inorganic component includes, for example, a glass having a softening point of 400° C. to 750° C. Specifically, a glass including silicon oxide ($SiO_2$) as a main component and including any one of barium oxide (BaO), zinc oxide (ZnO), bismuth oxide ($Bi_2O_3$), and clarified boron ($B_2O_3$) is exemplified. In this way, when the glass is included in addition to copper, nickel, and lanthanum boride, the resistance value of the resistor can be increased, and adhesion between a substrate and the resistor can be enhanced when the resistor is formed on the substrate.

Further, as inorganic components, alumina ($Al_2O_3$), titania ($TiO_2$), silica ($SiO_2$) or the like may be included. Since such a component has a high melting point and is not reduced easily, deformation of the resistor can be suppressed even when the resistor is heated to a high temperature.

In a non-limiting aspect of the resistor of the present disclosure, the total content of copper, nickel, and lanthanum boride may be 40% by mass or more and 70% by mass or less out of 100% by mass of all components constituting the resistor, and the remainder may be formed of an inorganic component. When such a configuration is satisfied, the resistor has hardness where laser trimming is easily performed, and thus it is possible to more easily perform the laser trimming.

Further, a mass ratio of copper and nickel to lanthanum boride may be set so that copper and nickel:lanthanum boride is equal to 60 to 75:25 to 40. When such a configuration is satisfied, it becomes difficult for the resistor to harden, and laser trimming can be performed more easily. Further, a mass ratio of copper to nickel may be set so that copper:nickel is equal to 50 to 70:30 to 50. When such a configuration is satisfied, it becomes further difficult for the resistor to be harder.

Here, the component constituting the resistor can be confirmed by measuring the resistor using an X-ray diffraction apparatus (XRD) and comparing the obtained result with the JCPDS card.

Alternatively, the component constituting the resistor can be confirmed by using an energy dispersive spectroscopy analyzer (EDS) attached to a scanning electron microscope (SEM). Specifically, the resistor is cut and a cross section obtained by polishing the cut surface with a cross section polisher (CP) is set as an observation surface. Then, using the SEM, the observation surface is observed at 1000 to 10000-fold magnification and X-rays are irradiated to a portion of crystal particles confirmed on the observation surface and a portion other than the crystal particles by using EDS attached to the SEM. Next, in the crystal particles, the presence of copper is detected, and when the content of copper is 70% by mass or more by semi-quantitative analysis, the crystal particles are considered copper particles. Further, when copper and nickel are detected in a portion other than the crystal particles, it can be said that the resistor includes copper and nickel. Furthermore, when boron and lanthanum are simultaneously detected in the portion other than the crystal particles, the resistor can be regarded as including lanthanum boride.

When the presence of copper particles is confirmed, the observation surface is photographed using SEM. Then, in the taken photograph, the portions of the copper particles are colored. Next, image analysis is performed by applying a technique called particle analysis of image analysis software "A-ZO KUN" (Registered trademark, manufactured by Asahi Kasei Engineering Co., Ltd., hereinafter, when described as image analysis software "A-ZO KUN", it indicates the image analysis software manufactured by Asahi Kasei Engineering Co., Ltd.), using a photograph in which copper particle portions are colored. As the analysis condition of "A-ZO KUN", for example, the brightness of the crystal particle may be set to "BRIGHT", the binarization method may be set to "AUTOMATIC", and the shading may be set to "YES". By this particle analysis, the particle diameter of the copper particles can be confirmed. That is, by this particle analysis, it can be confirmed whether copper particles having a particle diameter of 2.5 μm or more exist.

The content of each of copper, nickel, and lanthanum boride in the resistor can be calculated by the following method. First, it is confirmed that copper, nickel, and lanthanum boride are contained in the resistor by the above-described method using XRD. In the following description, a case where the chemical formula of lanthanum boride is $LaB_6$ will be described. Next, the content of copper, nickel and lanthanum boride ($LaB_6$) can be calculated by performing quantitative analysis of copper (Cu), nickel (Ni), lanthanum (La), and boron (B) included in the resistor using an ICP emission spectroscopic analyzer (ICP).

Further, in a non-limiting aspect of the resistor of the present disclosure, an area ratio occupied by the copper particles having a particle diameter of 2.5 μm or more may be 2 area % or more and 10 area % or less. When such a configuration is satisfied, variation in trimming is reduced in a non-limiting aspect of the resistor of the present disclosure, and thus it is possible to further easily perform the laser trimming.

Here, as similar to the method of confirming the presence of copper particles having a particle diameter of 2.5 μm or more, the area ratio occupied by copper particles having a particle diameter of 2.5 μm or more in the resistor can be calculated by image analysis by applying the particle analysis method of the image analysis software "A-ZO KUN".

Further, in a non-limiting aspect of the resistor of the present disclosure, the resistor may have a void and the area ratio occupied by the void may be 12 area % or more and 35 area % or less. When such a configuration is satisfied, it is further easy for the resistor to be subjected to laser trimming in a non-limiting aspect of the present disclosure.

Here, in order to calculate the area ratio occupied by the voids in the resistor, a similar method of calculating the area ratio occupied by the copper particles having a particle diameter of 2.5 μm or more may be performed using the photograph where the voids are colored.

Next, a circuit board 10 of a non-limiting aspect of the present disclosure will be described with reference to FIG. 1. A non-limiting aspect of the circuit board 10 of the present disclosure illustrated in FIG. 1 includes a substrate 2, a resistor 1 according to a non-limiting aspect of the present disclosure located on the substrate 2, a metal layer 3, and a glass layer 4 located on the resistor 1. In FIG. 1, an example in which the resistor 1 is provided between a metal layer 3a and a metal layer 3b is illustrated, whereby the current flowing through the metal layer 3 can be adjusted. In addition, an example where the glass layer 4 is also located on a part of the metal layer 3 and on the substrate 2 is illustrated.

Here, any material may be used as the material constituting the substrate 2 as long as it is an insulator, and in the case of ceramics, the substrate has both excellent mechanical strength and heat dissipation properties. In this case, as ceramics, aluminum oxide ceramics, zirconium oxide ceramics, composite ceramics of aluminum oxide and zirconium oxide, silicon nitride ceramics, aluminum nitride ceramics, silicon carbide ceramics, mullite ceramics, or the likes can be used. When the substrate 2 is made of aluminum oxide ceramics, processing is relatively easier to be performed while having the mechanical strength required for the circuit board 10. When the substrate 1 is made of silicon nitride ceramics or aluminum nitride ceramics, it is particularly excellent in heat dissipation properties.

Further, as the metal layer 3, one in which the main component is at least one of copper, silver, and aluminum can be used. In particular, the main component of the metal layer 3 may be copper in a non-limiting aspect of the present disclosure because copper has low electrical resistivity and high heat dissipation properties. Here, the main component in the metal layer 3 is a component containing 60% by mass or more out of 100% by mass in total of all the components constituting the metal layer 3.

Further, as the glass layer 4, the glass may include any one of $R_2O$—$B_2O_3$—$SiO_2$-based glass (R: alkali metal element), $SiO_2$—$Bi_2O_3$—$B_2O_3$-based glass, $R_2O$—$SiO_2$—$B_2O_3$—$Bi_2O_3$-based glass as a main component in a non-limiting aspect of the present disclosure. The glass layer 4 may include titanium oxide or zirconium oxide in order to improve the reflectance of the glass layer 4 with respect to visible light rays.

Further, when the resistor 1 in the circuit board 10 according to a non-limiting aspect of the present disclosure is divided into two equal parts in a thickness direction of the resistor 1, if one of the two equal parts on the substrate 2 side is defined as a first region and the other of the two equal parts on the glass layer 4 side is defined as a second region, the area ratio occupied by the voids in the first region may be larger than the area ratio occupied by the voids in the second region. If such a configuration is satisfied, when laser trimming is performed on the resistor 1 in a state of constituting the circuit board 10, if the laser beam is applied to the resistor 1 from the glass layer 4 side, energy of the laser beam is easily absorbed in the second region of the resistor 1 and thus laser trimming is facilitated.

In this case, when the area ratio occupied by the voids in the first region is larger than the area ratio occupied by the voids in the second region by 4 area % or more, laser trimming is further facilitated.

Here, in order to calculate the area ratios occupied by the voids in the first region and the second region of the resistor 1, a similar method of calculating the area ratio occupied by the copper particles having a particle diameter of 2.5 µm or more is carried out on each of the first region and the second region by using a photograph where the voids are colored.

Figure 2:
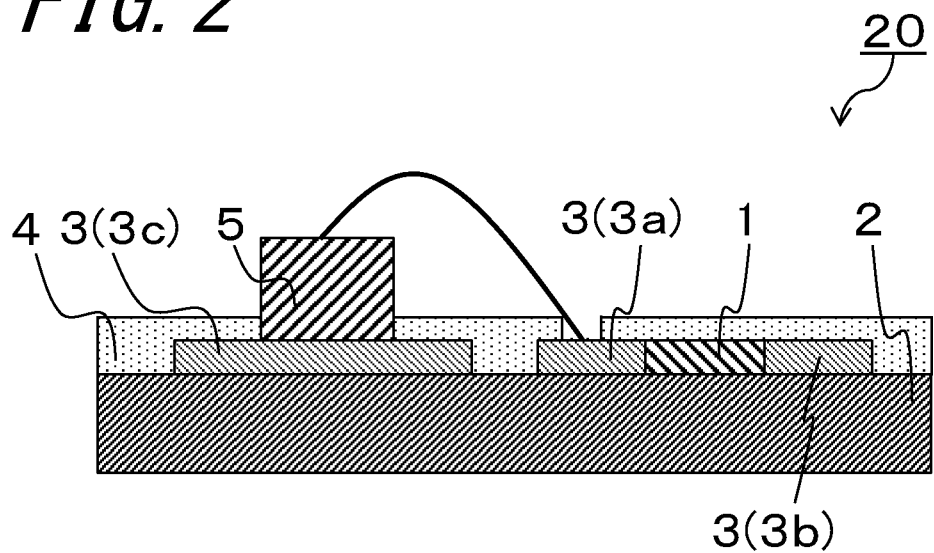
FIG. 2 is a cross-sectional view illustrating an example of an electronic device including the circuit board according to a non-limiting aspect of the present disclosure.

Next, an electronic device 20 according to a non-limiting aspect of the present disclosure will be described with reference to FIG. 2. The electronic device 20 according to a non-limiting aspect of the present disclosure illustrated in FIG. 2 includes the circuit board 10 according to a non-limiting aspect of the present disclosure. Specifically, in addition to the resistor 1, the substrate 2, the metal layer 3, and the glass layer 4, an electronic component 5 located on the metal layer 3 is provided. FIG. 2 illustrates an example in which the electronic component 5 is located on the metal layer 3c and the electronic component 5 and the metal layer 3a are electrically connected by a bonding wire.

In this case, as the electronic component 5, for example, a semiconductor element such as a light emitting diode (LED) element, an insulated gate bipolar transistor (IGBT) element, an intelligent power module (IPM) element, a metal-oxide semiconductor field effect transistor (MOSFET) element, a freewheeling diode (FWD) element, a giant transistor (GTR) element or a Schottky barrier diode (SBD), a heat generating device for a sublimation type thermal printer head or a thermal ink jet printer head, a Peltier element, or the like can be used.

Hereinafter, an example of a method for manufacturing the resistor 1 according to a non-limiting aspect of the present disclosure will be described. Here, a method of forming the resistor 1 on the substrate 2 made of ceramics will be described as an example.

First, for example, aluminum nitride ceramics or aluminum oxide ceramics is prepared as the substrate 2 by a known molding method and firing method. In forming the aluminum oxide ceramic, barium oxide (BaO) or zirconium oxide ($ZrO_2$) may be contained so as to improve the reflectance of the substrate 2 with respect to visible light rays. Further, the thickness of the substrate 2 is, for example, 0.15 mm or more and 1.5 mm or less.

Next, a resistor paste is prepared in order to form the resistor 1. Here, the resistor paste is formed of a combination of a conductive powder, an inorganic powder, and an organic vehicle. Incidentally, the organic vehicle plays a role of improving the fluidity of the resistor paste.

The conductive powder is formed of a copper powder, a nickel powder, and a lanthanum boride powder. Here, the conductive powder may be blended so that the mass ratio of copper powder and nickel powder:lanthanum boride powder is equal to 60 to 75:25 to 40. Also, the conductive powder may be blended so that the mass ratio of copper powder: nickel powder is equal to 50 to 70:30 to 50. Instead of the copper powder and the nickel powder, a copper nickel alloy powder may be used.

The printability of the resistor paste is maintained by using a copper powder or a copper nickel alloy powder having an average particle diameter of 0.2 µm or more and 0.5 µm or less, and it is possible to form copper particles having a particle diameter of 2.5 µm or more during firing by moderately agglomerating the copper particles with easy at the time of sintering.

Further, as the inorganic powder, a glass including silicon oxide ($SiO_2$) as a main component and including barium oxide (BaO), zinc oxide (ZnO), bismuth oxide ($Bi_2O_3$), boron oxide ($B_2O_3$) may be used. In addition to the glass described above, alumina ($Al_2O_3$), titania ($TiO_2$), silica ($SiO_2$) may be used.

Also, the organic vehicle is a mixture of an organic binder and an organic solvent. As the organic binder, a polyacrylic acid ester may be used from the viewpoint of thermal decomposability. Terpineol and alkyl cellosolve acetate may be used as the organic solvent from the viewpoint of the fluidity of the paste. Further, the mass ratio of the organic binder to the organic solvent in the organic vehicle may be set so that organic binder:organic solvent is equal to 15 to 40:60 to 85.

Resistor paste is prepared by weighing and mixing each powder (conductive powder, inorganic powder, organic vehicle) so that the total amount of copper, nickel and lanthanum boride in the resistor 1 after firing is 40% by mass or more. Specifically, the amount of the conductive powder may be 40 parts by mass or more and 70 parts by mass or less with respect to 100 parts by mass of the total of the conductive powder and the inorganic powder in a non-limiting aspect of the present disclosure. Further, the amount of the inorganic powder may be set such that the total amount of the above-described glass:alumina, titania, and silica is equal to 20:80 to 80:20 in terms of a mass ratio. Further, the organic vehicle is added in an amount of 20 parts by mass or more and 30 parts by mass or less with respect to 100 parts by mass in total of the conductive powder and the inorganic powder.

Then, the obtained resistor paste is screen-printed on a desired region on the substrate 2 and dried and degreased at a temperature of 70° C. to 130° C. Here, by drying and degreasing at a temperature of 80° C. to 100° C., it is possible to make the organic vehicle exist to some extent in the screen-printed resistor paste, and therefore it is possible to form voids inside the resistor 1 when the organic vehicle volatilizes during firing.

Next, heat treatment is performed by holding the screen-printed resistor paste at a maximum temperature of 800° C. to 960° C. for 7 minutes to 20 minutes under a nitrogen atmosphere. Here, as the firing temperature is higher and the firing time is longer, more copper particles having a particle diameter of 2.5 µm or more can be precipitated.

Then, after the heat treatment, the resistance value is adjusted by laser trimming to obtain the resistor 1 according to a non-limiting aspect of the present disclosure. For laser trimming, an arbitrary target resistance value may be set under trimming conditions with a trimming speed of 10 mm/sec to 50 mm/sec using a laser beam with an output of 1 W to 10 W and a frequency of 1 kHz to 5 kHz.

Two types of resistor pastes (first resistor paste, second resistor paste) having different addition amounts of an organic vehicle are prepared and, first, a first resistor is formed on the substrate 2 with the first resistor paste, and then a second resistor is formed on the first resistor with the second resistor paste. In such a manner, it is possible to obtain the resistor 1 including the first resistor and the second resistor having different area ratios occupied by the voids.

Next, the circuit board 10 according to a non-limiting aspect of the present disclosure can be obtained by forming the metal layer 3 on the substrate 2 on which the resistor 1 described above is formed, and thereafter, forming the glass layer 4 so as to cover the desired regions of the resistor 1, the substrate 2, and the metal layer 3. Further, the laser trimming described above may be performed after the glass layer 4 is formed.

The metal layer 3 can be obtained by screen-printing a known metal paste including copper as a main component on the substrate 2, and thereafter, firing the screen-printed metal paste in a nitrogen atmosphere. Further, the thickness of the metal layer 3 may be, for example, 5 μm or more and 25 μm or less. In order to set the thickness of the metal layer 3 to a desired thickness, screen printing, drying, and heat treatment may be repeated or processes of screen printing and drying may be performed a plurality of times and then heat treatment may be performed collectively.

Further, the surface of the metal layer 3 may be partially plated. By performing the plating treatment as described above, adhesion with the electronic component 4, the bonding wire, or the like is facilitated and corrosion of the metal layer 3 due to oxidation can be suppressed. The kind of plating may be known plating and examples thereof include gold plating, silver plating, nickel-gold plating, and nickel-palladium-gold plating.

The glass layer 4 can be formed by the following manner. A glass paste obtained by mixing an organic vehicle with a glass powder composed mainly of any one of $R_2O$—$B_2O_3$—$SiO_2$-based glass (R: alkali metal element), $SiO_2$—$Bi_2O_3$—$B_2O_3$-based glass, and $R_2O$—$SiO_2$—$B_2O_3$—$Bi_2O_3$-based glass is prepared and printing is carried out so as to cover desired regions of the resistor 1, the substrate 2, and the metal layer 3, and then drying, degreasing, and firing are carried out. Further, the thickness of the glass layer 4 may be 10 μm or more and 20 μm or less. Further, the glass paste may contain titanium oxide or zirconium oxide.

Further, in manufacturing of a non-limiting aspect of circuit board 10 of the present disclosure, when the resistor 1 and the metal layer 3 are formed by the method described above using the substrate 2 on which dividing grooves are formed and then the substrate 2 are divided, it is possible to efficiently manufacture a large number of circuit boards 10.

Next, the electronic device 20 according to a non-limiting aspect of the present disclosure can be obtained by mounting the electronic component 5 on the metal layer 3 not covered with the glass layer 4 in the circuit board 10 described above.

Hereinafter, examples of the present disclosure will be specifically described. However, the present disclosure is not limited to the following examples.

Example 1

Samples were manufactured in which copper particles having a particle diameter of 2.5 μm or more were present or absent and the area ratio occupied by copper particles having a particle diameter of 2.5 μm or more and the area ratio occupied by voids were different, and ease of adjustment of the resistance value by laser trimming was evaluated.

First, a substrate made of aluminum oxide ceramics was prepared by a known molding method and firing method.

Next, as a conductive powder, a mixed powder having an average particle diameter of 0.3 μm and formed of a copper powder, a nickel powder, and a lanthanum boride powder was prepared. Further, the mixed powder was blended so that the mass ratio of copper powder:nickel powder:lanthanum boride powder was equal to 42:28:30.

In addition, as the inorganic powder, an $SiO_2$—ZnO—$B_2O_3$-based glass including silicon oxide as a main component and including zinc oxide and boron oxide and alumina were prepared.

Next, a resistor paste was prepared to form a resistor. The resistor paste was manufactured by blending the mixed powder, the $SiO_2$—ZnO—$B_2O_3$-based glass and the alumina in a mass ratio of 50:25:25 and adding 25 parts by mass of the organic vehicle to 100 parts by mass in total thereof.

Here, as the organic vehicle, a mixture of a polyacrylic acid ester as an organic binder and terpineol as an organic solvent was used. Further, the organic binder and the organic solvent were adjusted so that the mass ratio of organic binder:organic solvent was equal to 30:70.

Then, the obtained resistor paste was screen-printed so that ten square patterns each having a thickness of 24 μm and a size of 1 mm×1 mm were located in a desired region on the substrate, and was kept at the temperature shown in Table 1 for 10 minutes, and then was dried and degreased. Thereafter, heat treatment was performed by maintaining the resistor paste at the maximum temperature shown in Table 1 for 15 minutes under a nitrogen atmosphere to obtain Sample Nos. 1 to 12.

Next, in each sample, the confirmation of the presence or absence of copper particles having a particle diameter of 2.5 μm or more and the calculation of the area ratio occupied by the copper particles having a particle diameter of 2.5 μm or more were carried out by the following method. First, the resistor of each sample was cut and the cut surface was polished with CP. Then, the copper particles were specified by irradiating the crystal particles confirmed in the polished cross section with X-rays using the EDS attached to the SEM. Next, in the photograph of the above-described cross section taken using SEM, the copper particle portion was colored. Then, using the photograph where the copper particle portions were colored, image analysis was performed by applying the particle analysis method of the image analysis software "A-ZO KUN". Here, as the analysis condition of "A-ZO KUN", the brightness of the crystal particle was set to "BRIGHT", the binarization method was set to "AUTOMATIC", and the shading is set to "YES". Next, by the particle analysis, the presence or absence of copper particles having a particle diameter of 2.5 μm or more was confirmed and the area ratio occupied by the copper particles having a particle diameter of 2.5 mm or more was calculated.

Further, the area ratio occupied by the voids in each sample was calculated by a method similar to that described above, using a photograph where the voids were colored.

Next, the ease of adjustment of the resistance value by laser trimming was evaluated for the resistor in each sample by performing the following method. First, using a laser beam with an output of 3 W and a frequency of 5 kHz, ten resistors of respective samples were subjected to laser trimming under the trimming conditions of trimming speed of 30 mm/sec with the target resistance value set to 20 Ω/sq. Then, the resistance values of the ten resistors after the laser trimming was performed were measured and the value of $CV=(\sigma/A)\times100\%$ was obtained with the standard deviation set to σ and the average value set to A. When the value of CV was less than 0.5%, the value was rated as "A", when the value was 0.5% or more and less than 0.8%, the value was rated as "B", and when the value was 0.8% or more and less than 1.0%, the value was rated as "C", and further when the value was 1.0% or more, the value was rated as "D". Here, it could be said that one with the evaluation of A was the easiest to adjust the resistance value by laser trimming and one with D evaluation is the most difficult to adjust the resistance value by laser trimming. The results are shown in Table 1.

TABLE 1

| Sample No. | Drying, Degreasing Temperature (° C.) | Maximum temperature (° C.) | Presence or absence of copper particle with 2.5 μm or more | Arearatio occupied by copper particles (%) | Area ratio occupied by void portions (%) | Evaluation |
|---|---|---|---|---|---|---|
| 1 | 130 | 780 | Absent | 0 | 9 | D |
| 2 | 130 | 800 | Present | 1 | 8 | C |
| 3 | 130 | 830 | Present | 2 | 7 | B |
| 4 | 130 | 860 | Present | 4 | 6 | B |
| 5 | 130 | 900 | Present | 7 | 5 | B |
| 6 | 130 | 950 | Present | 10 | 4 | B |
| 7 | 130 | 960 | Present | 11 | 3 | C |
| 8 | 110 | 900 | Present | 7 | 11 | B |
| 9 | 100 | 900 | Present | 7 | 12 | A |
| 10 | 90 | 900 | Present | 7 | 24 | A |
| 11 | 80 | 900 | Present | 7 | 35 | A |
| 12 | 70 | 900 | Present | 7 | 36 | B |

As shown in Table 1, Sample No. 1 was evaluated as D, whereas Sample Nos. 2 to 12 were evaluated as C or higher. From the results, it was found that a resistor including copper, nickel, and lanthanum boride in a total amount of 40% by mass or more, and further including copper particles having a particle diameter of 2.5 μm or more was easy to adjust the resistance value by laser trimming.

In addition, Sample Nos. 3 to 6 and Sample Nos. 9 to 11 were evaluated as B or higher. From the results, it was found that adjustment of the resistance value by laser trimming became easier in the case of a resistor in which the area ratio occupied by copper particles having a particle diameter of 2.5 μm or more was 2 area % or more and 10 area % or less.

Further, Sample Nos. 9 and 10 were evaluated as A. From the results, it was found that adjustment of the resistance value by laser trimming becomes extremely easy in the case of a resistor in which the area ratio occupied by the voids was 12 area % or more and 35 area % or less.

Example 2

A sample in which, when the resistor was equally divided in a thickness direction and one on the substrate side was defined as a first region, and further the other on the glass layer side was defined as a second region, the sample of the area ratio occupied by the voids was different in the first region and the second region was prepared, and then ease of adjustment of the resistance value by laser trimming was evaluated.

First, a first resistor paste and a second resistor paste were respectively manufactured in the same manner as that of the sample No. 2 of Example 1 except that the addition amount of the organic vehicle to the total amount of 100 parts by mass of the conductive powder and the inorganic powder was adjusted to values shown in Table 2.

Next, the first resistor paste was screen-printed so that ten square patterns each having a thickness of 12 μm and a size of 1 mm×1 mm were located in a desired region on the substrate and drying, degreasing, and heat treatment were carried out under the same conditions as that of the sample No. 2 of Example 1. In such a manner, a first resistor was obtained. Next, the second resistor paste was screen-printed on the first resistor so as to have a thickness of 12 μm and drying, degreasing, and heat treatment were carried out under the same conditions as that of the sample No. 2 of Example 1. In such a manner, a second resistor was obtained. Here, the combination of the first resistor and the second resistor is a resistor. Next, a glass layer was formed on the substrate and the resistor by using a glass paste so that only the resistors of the portions necessary for the measurement of the resistance value described below were exposed.

First, an $R_2O$—$B_2O_3$—$SiO_2$-based glass powder (R: alkali metal element) was prepared. Also, a titanium oxide powder was prepared. Here, the titanium oxide powder was weighed to 15 parts by mass with respect to 100 parts by mass of the glass powder.

Next, an organic vehicle is prepared and the glass powder, the titanium oxide powder, and the organic vehicle were weighed and mixed as desired, in such a manner that a glass paste was prepared. As for the compounding amount in this case, the total amount of the glass powder and the titanium oxide powder was set to 70 parts by mass and the remainder was an organic vehicle.

Then, the obtained glass paste was printed so that the thickness of the glass layer after firing became 16 μm, and then drying, degreasing, and firing are carried out to form a glass layer, thereby obtaining Sample Nos. 13 to 17. Here, in resistors of respective Sample Nos. 13 to 17 obtained by such a method, the first resistor becomes a first region of the resistor and the second resistor becomes a second region of the resistor.

Next, in each sample, the area ratio occupied by the voids in each of the first region and the second region was calculated by the similar method as in Example 1, using a photograph in which the voids of the resistors were colored.

Next, ease of adjustment of the resistance value of the resistor by laser trimming was evaluated in each sample as in Example 1 except that the laser beam was irradiated from the glass layer side.

The results are shown in Table 2.

TABLE 2

| Sample No. | Organic vehicle (part by mass) | | Area ratio occupied by void portions (area %) | | Evaluation |
|---|---|---|---|---|---|
| | First resistor paste | Second resistor paste | First region | Second region | |
| 13 | 25 | 25 | 8 | 8 | C |
| 14 | 23 | 27 | 7 | 9 | C |
| 15 | 27 | 23 | 9 | 7 | B |

TABLE 2-continued

| Sample No. | Organic vehicle (part by mass) | | Area ratio occupied by void portions (area %) | | Evaluation |
| --- | --- | --- | --- | --- | --- |
| | First resistor paste | Second resistor paste | First region | Second region | |
| 16 | 28 | 22 | 10 | 6 | A |
| 17 | 29 | 21 | 11 | 5 | A |

As shown in Table 2, Sample Nos. 15 to 17 were evaluated as B or higher. From the result, it was found that it is easy to adjust the resistance value by laser trimming in the case of a resistor in which the area ratio occupied by the voids in the first region is larger than the area ratio occupied by the voids in the second region.

In addition, Sample Nos. 16 and 17 were evaluated as A or higher. From the result, it was found that it is extremely easy to adjust the resistance value by laser trimming in the case of a resistor in which the area ratio occupied by the voids in the first region is 4 area % or more larger than the area ratio occupied by the voids in the second region.

REFERENCE SIGNS LIST

1: Resistor
2: Substrate
3: Metal layer
4: Glass layer
5: Electronic component
10: Circuit board
20: Electronic device

What is claimed is:

1. A resistor, comprising:
materials comprising copper, nickel, and lanthanum boride,
wherein
a content of the materials is 40% by mass or more with respect to a total material content of the resistor, and
the copper comprises copper particles having a particle diameter of 2.5 µm or more.

2. The resistor according to claim 1, wherein
an area ratio occupied by the copper particles having the particle diameter of 2.5 µm or more is 2 area % or more and 10 area % or less.

3. The resistor according to claim 1, further comprising voids,
wherein
an area ratio occupied by the voids is 12 area % or more and 35 area % or less.

4. A circuit board, comprising:
a substrate;
the resistor according to claim 1, the resistor located on the substrate;
a metal layer on the resistor; and
a glass layer located on the resistor.

5. The circuit board according to claim 4, wherein
the resistor comprises a first half part on a substrate side and a second half part on the glass layer side in a thickness direction,
a first area ratio occupied by voids in the first half part is larger than a second area ratio occupied by voids in the second half part.

6. The circuit board according to claim 5, wherein
the first area ratio is larger than the second area ratio by 4 area % or more.

7. An electronic device, comprising:
the circuit board according to claim 4; and
an electronic component located on the metal layer of the circuit board.

* * * * *